United States Patent [19]

Choi

[11] Patent Number: 6,093,889
[45] Date of Patent: Jul. 25, 2000

[54] SEMICONDUCTOR PACKAGE AND MOUNTING SOCKET THEREOF

[75] Inventor: Jae Myoung Choi, Ichon-shi, Rep. of Korea

[73] Assignee: Hyundai Electronics Industries Co., Ltd., Ichon-shi, Rep. of Korea

[21] Appl. No.: 08/995,420

[22] Filed: Dec. 19, 1997

[30] Foreign Application Priority Data

Dec. 20, 1996 [KR] Rep. of Korea ..................... 96-68905

[51] Int. Cl.[7] .................................................. H01L 23/28
[52] U.S. Cl. ...................... 174/52.2; 174/52.3; 174/52.4; 361/260; 361/761; 361/764; 257/723; 257/784; 257/684; 257/700
[58] Field of Search ................................. 174/52.1, 52.3, 174/52.4; 361/260, 761, 764; 257/723, 784, 724, 684, 700

[56] References Cited

U.S. PATENT DOCUMENTS

| 5,669,783 | 9/1997 | Inoue et al. | 439/331 |
| 5,731,633 | 3/1998 | Clayton | 257/723 |
| 5,763,943 | 7/1998 | Baker et al. | 257/686 |
| 5,818,107 | 10/1998 | Pierson et al. | 257/723 |

*Primary Examiner*—William A. Cuchlinski, Jr.
*Assistant Examiner*—Ronnie Mancho
*Attorney, Agent, or Firm*—Jacobson, Price, Holman & Stern, PLLC

[57] ABSTRACT

A mounting socket for a semiconductor package has socket leads that contact the semiconductor package's external leads. The semiconductor package has a package body surrounding a semiconductor chip, as well as internal and external leads. The external leads are formed in an ingot shape and project outwardly from the package body, and are adapted to connect with the socket leads or external terminals. The external leads contact external walls of the package body, thereby preventing undesired bending or breaking of the leads when the package is handled. Fixing and reworking of the package in the socket is easy, since the semiconductor package is inserted into grooves in the socket. It is possible to stack-mount or side-by-side-mount the package, depending on the socket shape, thus improving socket density and making the arrangement suitable for miniaturization.

5 Claims, 4 Drawing Sheets

SEMICONDUCTOR PACKAGE AND MOUNTING SOCKET THEREOF

BACKGROUND OF THE INVENTION

1. Field of the Invention

The present invention relates to a semiconductor package and mounting socket thereof. In particular, the present invention relates to a semiconductor package and mounting socket thereof suitable for miniaturization of a semiconductor device, in which an external lead connected to an external terminal is formed in a shape of ball that is supported in a package body.

2. Description of the Prior Art

Generally, in the manufacturing process of a semiconductor device, after devices such as circuits etc. are formed in a semiconductor chip, the semiconductor chip is mounted in a lead frame and sealed in the form of a package so as to protect from external shock and damage. Then, a contact terminal is extracted from one of the sealed portions so that it can be electrically connected to an external device.

The semiconductor package has a semiconductor chip mounted on a die pad of a rectangular shape with adhesives. The package is constructed in such a way that a plurality of leads are positioned at a given distance around the die pad, contact pads of the semiconductor chip are bonded to the die pad side of the leads with wires, and the semiconductor chip, the die pad and the wires are encapsulated by a package body made of epoxy mounting compound (hereinafter called "E.M.C").

This semiconductor package is in a form where a lead is connected to the external terminal (hereinafter called "external lead"), but can be classified into various types depending on the extraction direction, the packaging, or the mounting method of a chip. A single inline package (hereinafter called "SIP") type and a dual inline package (hereinafter called "DIP") type in which external leads project from one side or both sides of the package body is mainly used in the insertion mounting type such as memory devices of DRAM or SRAM etc. in which external leads are inserted into holes. A quad flat package (hereinafter called "QFP") type such as a central processing unit etc. in which external leads project from all directions of the package body is mainly surface-mounted on a printed circuit board (hereinafter called "PCB") in which external leads are curved in the shape of a gull wing.

In addition, there are general types in which a package is mounted on a die pad and connected to leads by wires depending on the mounting method of a semiconductor chip, a chip on lead (hereinafter called "COL") type or a lead on chip (hereinafter called "LOC") type in which contact terminals of a semiconductor chip are directly connected to leads, a chip on board (hereinafter called "COB") type in which a semiconductor chip is directly mounted on a PCB, a tape automated bonding (hereinafter called "TAB") type in which conductive wires serving as leads are included etc.

FIG. 1 is a sectional view of a semiconductor package according to a prior art, which is an example of DIP type.

First, as can be seen in FIG. 1, in the semiconductor package 1, a semiconductor chip 2 is mounted on a die pad 4, and a plurality of leads 16 are extended around the die pad 4 at a given distance. Internal leads 16A being one side of the leads 16 are bonded to the semiconductor chip 2 by wires 8, and a package body 3 encapsulating the semiconductor chip 2, the die pad 4 and the wire 8 is formed with EMC. External leads 16B are projected toward both sides of the package body 3.

In a semiconductor package according to the prior art as described, since external leads vertically curved against a package body are inserted into holes of PCB and then mounted thereon, there is a high possibility that the external leads are inclined to be deformed or cut upon handling or mounting and reworking of the package; and there are problems that deteriorate contact between the external leads and the holes and reduce electrical characteristic of a semiconductor package.

Increasing mounting density and thus miniaturization of a semiconductor device is made difficult because space necessary for an insertion mounting process must be secured and design of a socket into which external leads are inserted is limited.

SUMMARY OF THE INVENTION

It is an object of the present invention to solve the problems involved in the prior art, and to provide a method of a semiconductor package by forming an external lead connected to an external terminal in the shape of a ball that does not project from a package body, loading it in a socket and then mounting it so as to prevent deformation of the external lead and electrical contact defect of a semiconductor package when handling the package, thus allowing a more flexible design of socket and improving the mounting density.

It is another object of the present invention to provide a socket for mounting a semiconductor package, including grooves into which a semiconductor package external lead is formed in the shape of a ball in an insulating body, which is mounted on a PCB using a socket having a contact terminal, one side of which contacts the ball-shaped external lead and the other side of which projects from a body, and the number of the package can be in serial/in parallel loaded on the socket, thus improving the mounting density to be advantageously suitable for miniaturization of a semiconductor device.

In order to achieve the above object, one aspect of the semiconductor package according to the present invention is characterized by a package body surrounding a semiconductor chip; internal leads connected to contact pads of said semiconductor chip; and ingot-shaped external leads extending from said internal leads and projecting from sides of said package body.

Another aspect of the mounting socket for a semiconductor package is characterized by a body including grooves into which a semiconductor package is inserted, said package having external leads of ingot shape projecting from sides of a package body surrounding a semiconductor chip; internal contact terminals installed inside the grooves of the socket to contact said external leads; external contact terminals extending from said internal contact terminals to project toward outside said body.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENTS

Figure 1:
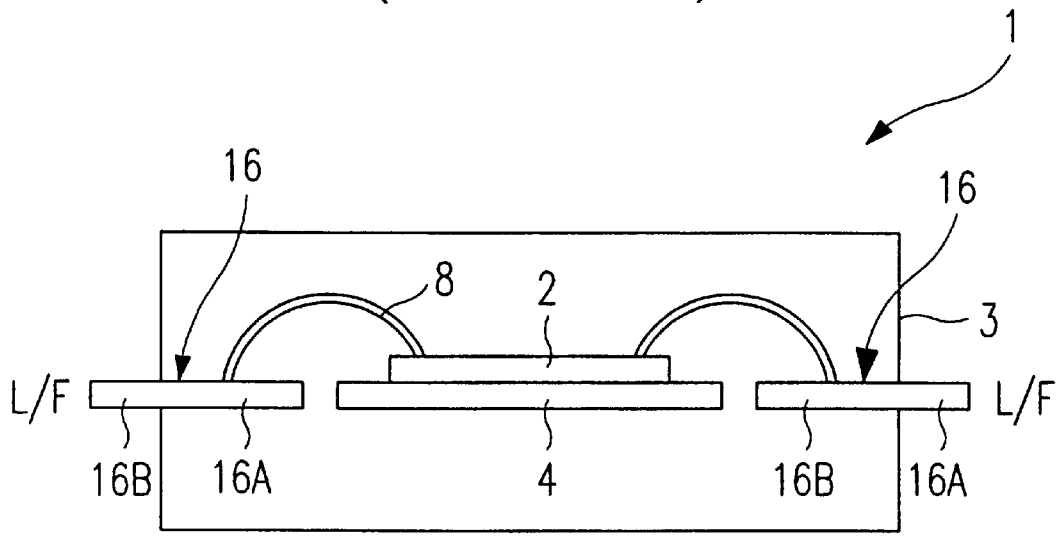
FIG. 1 is a sectional view of a semiconductor package according to the prior art.

Below, a semiconductor package and a socket for mounting thereof according to the present invention will be described in detail by reference to the accompanying drawings.

First, referring to FIG. 2, there are shown sectional views of a semiconductor package according to an embodiment of the present invention: that is, an example of wire-bonded DIP type, and they will be explained by reference to each other.

In the semiconductor package 10, a semiconductor chip 12 is loaded on rectangular die pad 14 with conductive adhesives, and a plurality of leads 16 are extended at a given distance with the die pad 14. Internal leads 16A being one side of the leads 16 are bonded to contact terminals (not shown) of the semiconductor chip 12 by wires 18, and a package body 20 encapsulating the semiconductor chip 12, the die pad 14 and the wire 18 for protecting against external damage is molded with EMC. External leads 16C of an ingot shape, i.e. spherical shape or oval shape are exposed toward both sides of the package body 20.

Here, since the external leads 16C of an ingot shape are Repressed to one side of the package body 20, it prevents damage such as curving, cutting upon handling or a mounting work and a reworking.

Though the DIP type in which external leads 16C project out of both sides of the package body 20 is exemplified in the above embodiment, the present invention is also applicable to the SIP type or the QFP type as well as COL or LOC not a wire bonding.

Figure 3:
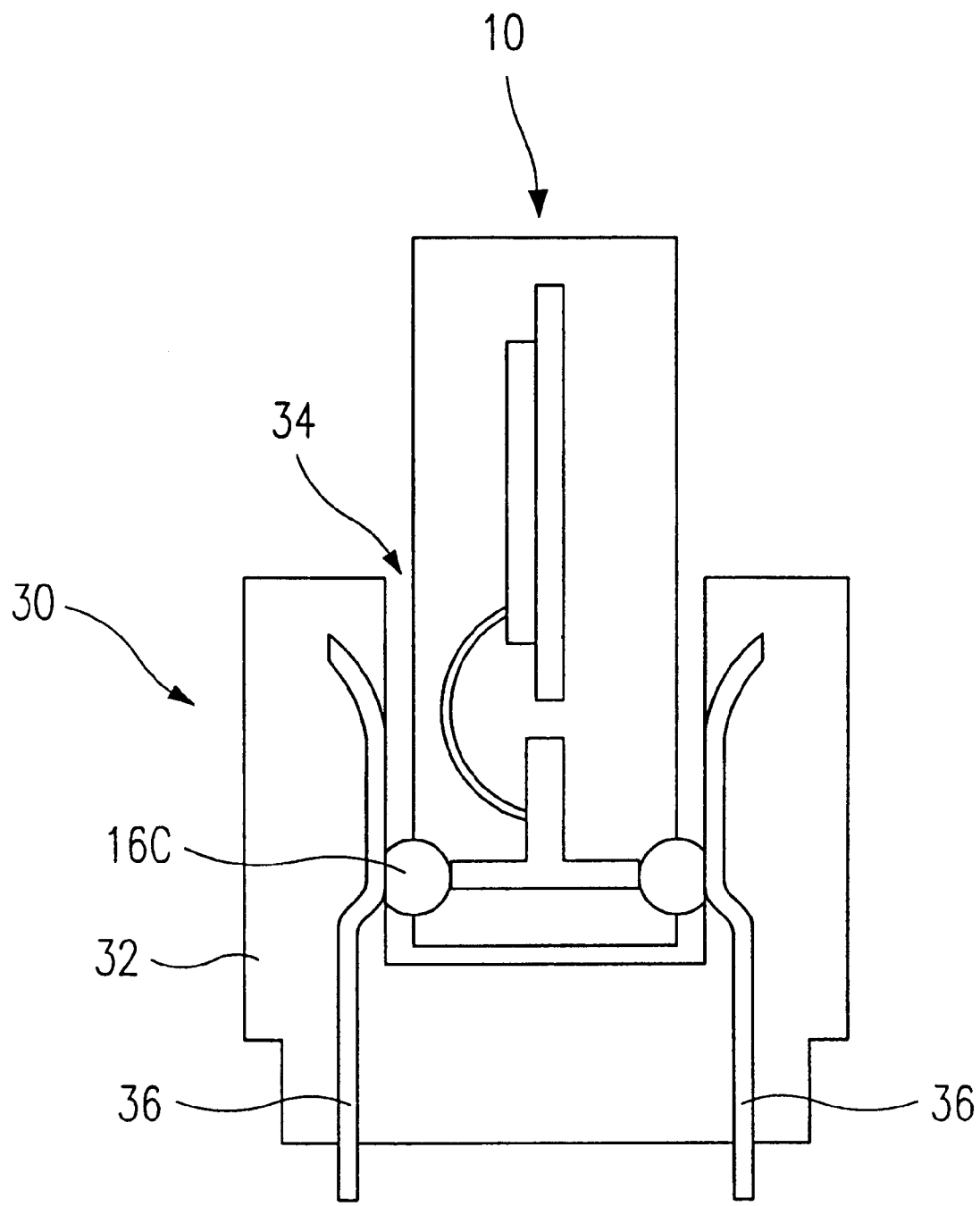
FIG. 3 is a sectional view of a state in which a semiconductor package is inserted into a socket according to one embodiment of the present invention.

FIG. 3 is a sectional view of a state in which a semiconductor package is inserted into a socket according to one embodiment of the present invention.

Figure 2:
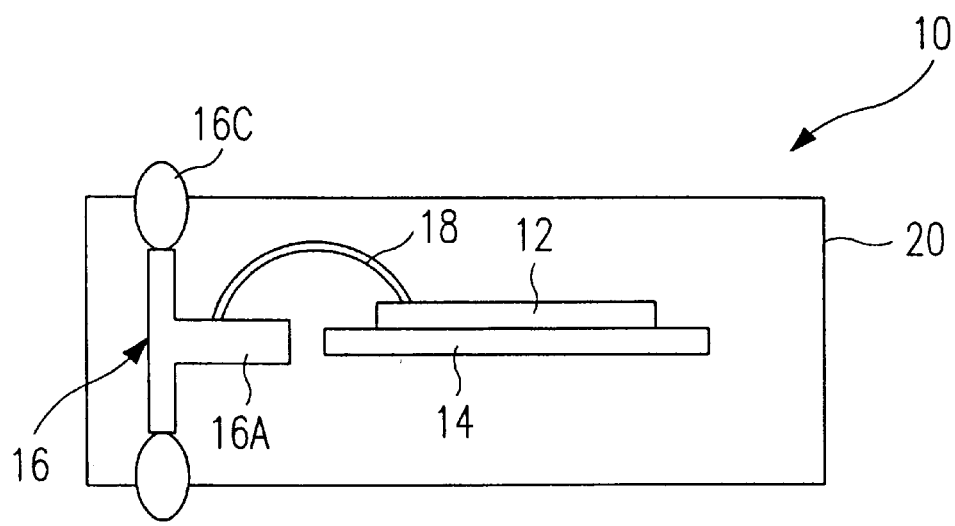
FIG. 2 is a sectional view of a semiconductor package according to an embodiment of the present invention.

First, the socket 30 has a groove 34 into which semiconductor package 10 is fixedly inserted on the upper side of body 32 made of insulating materials such as plastic or ceramics etc. as shown in FIG. 2. Thus, one side of socket leads 36 is exposed at a position corresponding to ingot-shaped external lead 16C of the semiconductor package 10 in the external side of the groove 34 to contact an external lead 16C of the semiconductor package 10, and the other side of the socket leads 36 is projected out of the socket body 32 so that it can be inserted into the external terminal. Since the socket leads 36 passes through body 32 and the middle portion of the socket leads 36 is curved, contacts with the external lead 16C can be improved when the semiconductor package 10 is mounted and the socket leads 36 can be prevented from deviating therefrom when handling it.

Since the semiconductor package 10 is inserted into the internal of groove 34, socket 30 can be easily arranged with semiconductor package 10 and mounted thereon, and a reworking thereof is simple.

Figure 4:
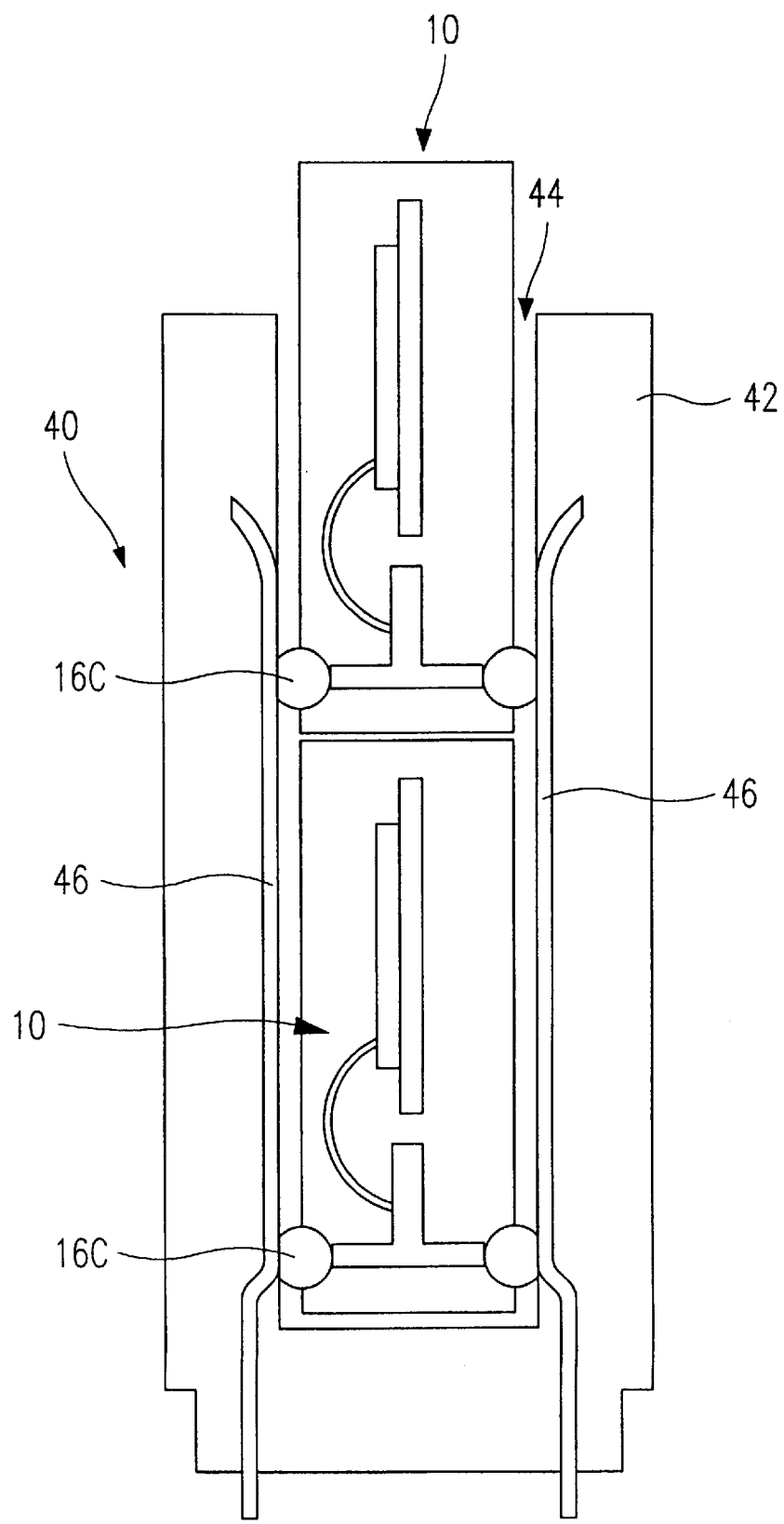
FIG. 4 is a sectional view of a state in which a semiconductor package is inserted into a socket according to another embodiment of the present invention.

FIG. 4 is a sectional view of a state in which a semiconductor package is combined into a socket according to another embodiment of the present invention, which is an example of a semiconductor package 10 stack-type socket.

Though socket 40 is constructed similarly to the socket structure shown in FIG. 4, it however differs from it in that two semiconductor packages 10 are stack-mounted with a long body 42 and a deep groove 44, and socket leads 46 to contact external leads 16C of the semiconductor package 10 are exposed long into the inside of the groove 44 so that two external leads 16C can be connected to a single socket lead 36. Though a case in which two semiconductor packages 10 are stacked is used as an example in this embodiment, more than two stacks can be used because additional mounting process such as bonding etc. is not required. In addition, in the above embodiment, though a single socket lead 46 contacts the two external leads 16C, it can be designed so that each of the external leads 16C in the semiconductor package 10, to be stacked, contacts the socket leads 46, respectively.

Figure 5:
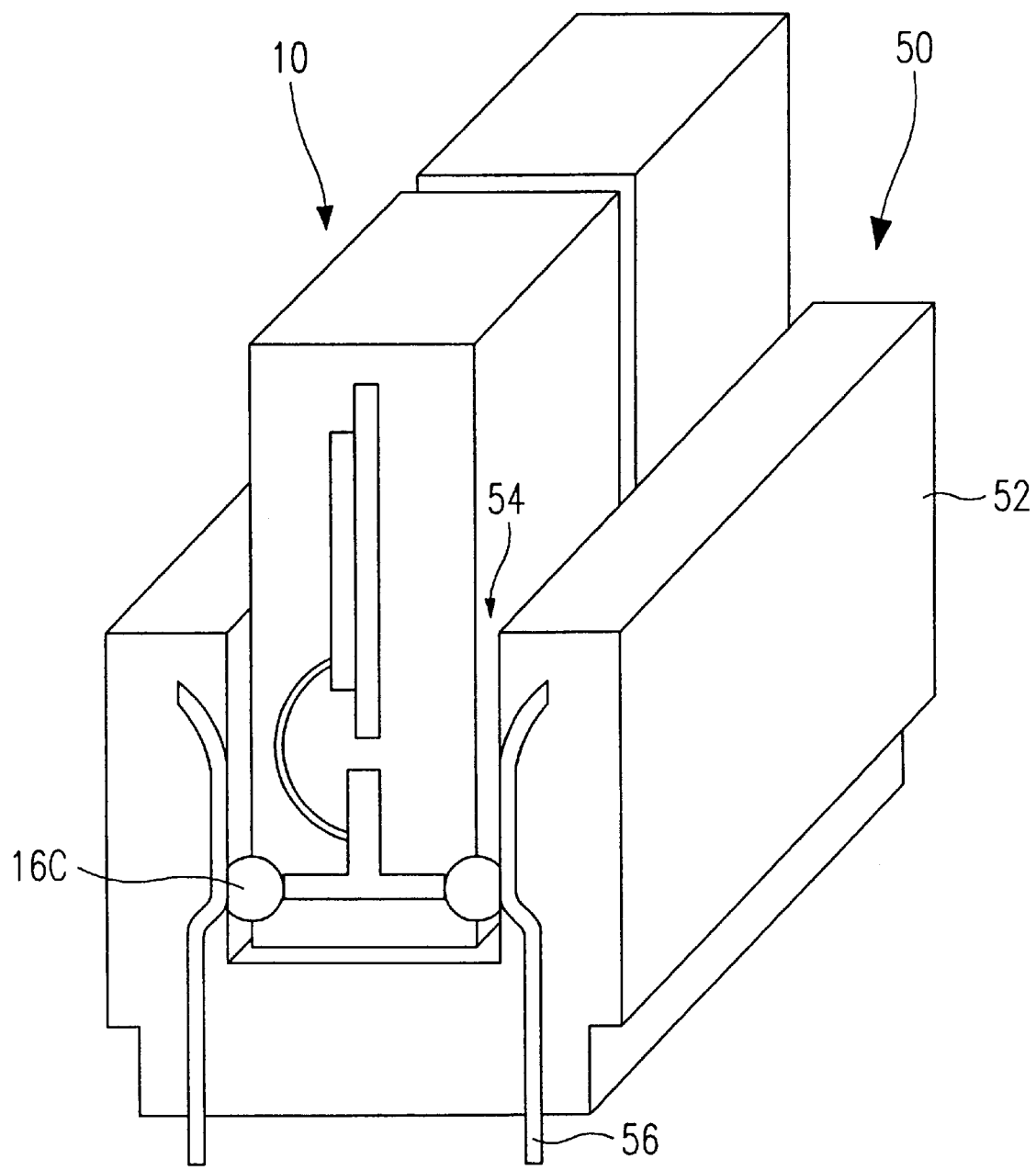
FIG. 5 is a sectional view of a state in which a semiconductor package is inserted into a socket according to still another embodiment of the present invention.

FIG. 5 is a sectional view of a state in which a semiconductor package is combined into a socket according to still another embodiment of the present invention, which is an example of a semiconductor package 10 connection-type socket.

Though socket 50 is basically constructed similarly to the socket shown in FIG. 3, it however differs from it in that body 52 and groove 54 are long extended in a horizontal direction, two semiconductor packages 10 are loaded serially, and socket leads connected therewith are formed at corresponding positions thereof.

Similarly, not only a number of semiconductor packages 1 can be serially loaded if the socket 50 is longer formed but also the sockets 40, 50 shown in FIGS. 4 and 5 can be combined into a serial stack-type socket.

As described above, since a semiconductor package and mounting socket thereof according to the present invention has a socket lead into which the semiconductor package is fixedly inserted and which contacts the external leads, causing them to connect to external signal terminals, in a semiconductor package comprising a package body surrounding a semiconductor chip and leads connected to the semiconductor chip in which external leads are formed in an ingot shape so that they are projected out of the package body and can be connected to external terminals, the external leads of the semiconductor package contact to external walls of the package body, thereby preventint the curving or breaking of the external leads upon handling of the semiconductor package. In addition, a mount fixing is simple and a reworking is easy since it is made possible connected to outside only by making the semiconductor package insertedly arranged into the grooves of the socket. Since a stack or a serial mounting of a semiconductor package can be made freely depending on the socket shape, socket density can be improved. Thereby, the semiconductor package and mounting socket thereof according to the present invention have an advantage in that they are suitable for miniaturization of a semiconductor device.

While the present invention has been described and illustrated herein with reference to the preferred embodiment thereof, it will be understood by those skilled in the art that various changes in form and details may be made therein without departing from the spirit and scope of the invention.

What is claimed is:

1. A semiconductor package, comprising:
   a semiconductor chip having at least one contact pad;
   a package body surrounding the semiconductor chip;
   internal leads connected to the semiconductor chip; and
   each of the internal leads terminating in two ball-shaped external leads projecting in opposite directions sideways from opposite sides of the packages body and outwardly away from the sides of the package body.

2. The semiconductor package of claim 1, further comprising:
   wires that connect the semiconductor chip and the internal leads.

3. The semiconductor package of claim 2, wherein:
   the semiconductor chip is directly connected to the internal leads.

4. The semiconductor package of claim 1, wherein:
   the external leads are formed in a spherical or oval shape.

5. A semiconductor module device, comprising:
   a) a semiconductor package including:
      1) a die pad;
      2) a semiconductor chip that is mounted on the die pad and that has contact pads;
      3) internal leads connected to the semiconductor chip;
      4) a package body surrounding the die pad, the semiconductor chip and the internal leads; and
      5) each of the internal leads terminating in two ball-shaped external leads projecting in opposite directions sideways from opposite sides of the package body and outwardly away from the sides of the package body; and
   b) a mounting socket for receiving the semiconductor package, the mounting socket including:
      1) a socket body having a groove into which the semiconductor package is inserted;
      2) internal contact terminals installed inside the groove; and
      3) external contact terminals extending from the internal contact terminals, and projecting toward outside the groove so as to contact the ball-shaped external leads of the semiconductor package when the semiconductor package is inserted into the groove of the mounting socket.

* * * * *